United States Patent
Gottwald et al.

(10) Patent No.: US 9,385,309 B2
(45) Date of Patent: Jul. 5, 2016

(54) SMOOTH SEED LAYERS WITH UNIFORM CRYSTALLINE TEXTURE FOR HIGH PERPENDICULAR MAGNETIC ANISOTROPY MATERIALS

(71) Applicant: QUALCOMM Incorporated, San Diego, CA (US)

(72) Inventors: Matthias Georg Gottwald, Leuven (BE); Jimmy Kan, San Diego, CA (US); Kangho Lee, San Diego, CA (US); Chando Park, San Diego, CA (US); Seung Hyuk Kang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/334,015

(22) Filed: Jul. 17, 2014

(65) Prior Publication Data

US 2015/0311427 A1  Oct. 29, 2015

Related U.S. Application Data

(60) Provisional application No. 61/985,444, filed on Apr. 28, 2014, provisional application No. 61/986,059, filed on Apr. 29, 2014.

(51) Int. Cl.

| | | |
|---|---|---|
| *H01L 29/82* | (2006.01) | |
| *H01L 43/12* | (2006.01) | |
| *H01L 43/08* | (2006.01) | |
| *G11C 11/16* | (2006.01) | |
| *H01L 43/10* | (2006.01) | |
| *H01L 27/22* | (2006.01) | |

(52) U.S. Cl.
CPC .............. *H01L 43/12* (2013.01); *G11C 11/161* (2013.01); *H01L 43/08* (2013.01); *H01L 43/10* (2013.01); *H01L 27/228* (2013.01)

(58) Field of Classification Search
CPC .......... H01L 29/82; H01L 43/00; H01L 21/00
USPC ................................................ 257/421; 438/3
See application file for complete search history.

(56) References Cited

U.S. PATENT DOCUMENTS

| | | | |
|---|---|---|---|
| 7,365,948 B2 | 4/2008 | Nakabayashi et al. | |
| 8,274,811 B2 | 9/2012 | Zhang et al. | |
| 2004/0188668 A1* | 9/2004 | Hamann | G11C 7/04 257/2 |
| 2007/0109147 A1 | 5/2007 | Fukuzawa et al. | |
| 2008/0247072 A1* | 10/2008 | Nozieres | G11C 11/16 360/59 |

(Continued)

FOREIGN PATENT DOCUMENTS

| | | |
|---|---|---|
| EP | 1903624 A2 | 3/2008 |
| JP | 2011003869 A | 1/2011 |
| WO | 2004109820 A1 | 12/2004 |

OTHER PUBLICATIONS

International Search Report and Written Opinion—PCT/US2015/022950—ISA/EPO—Jun. 19, 2015.

*Primary Examiner* — Phuc Dang
(74) *Attorney, Agent, or Firm* — Seyfarth Shaw LLP

(57) ABSTRACT

A method for fabricating a perpendicular magnetic tunnel junction (pMTJ) device includes growing a seed layer on a first electrode of the pMTJ device. The seed layer has a uniform predetermined crystal orientation along a growth axis. The method also includes planarizing the seed layer while maintaining the uniform predetermined crystal orientation of the seed layer.

12 Claims, 8 Drawing Sheets

(56) References Cited

U.S. PATENT DOCUMENTS

| | | | | |
|---|---|---|---|---|
| 2010/0065935 A1* | 3/2010 | Horng | ................... | B82Y 25/00 257/421 |
| 2011/0062537 A1* | 3/2011 | Oh | ....................... | B82Y 25/00 257/421 |
| 2011/0293967 A1 | 12/2011 | Zhang et al. | | |
| 2012/0299134 A1* | 11/2012 | Jan | ....................... | H01L 43/08 257/421 |
| 2013/0099780 A1* | 4/2013 | Ma | ....................... | B82Y 25/00 324/249 |
| 2013/0175644 A1 | 7/2013 | Horng et al. | | |
| 2013/0230741 A1 | 9/2013 | Wang et al. | | |
| 2013/0270523 A1* | 10/2013 | Wang | ...................... | H01L 43/10 257/30 |
| 2014/0256128 A1* | 9/2014 | Spurlin | ............ | H01L 21/76861 438/643 |

* cited by examiner

SMOOTH SEED LAYERS WITH UNIFORM CRYSTALLINE TEXTURE FOR HIGH PERPENDICULAR MAGNETIC ANISOTROPY MATERIALS

CROSS REFERENCE TO RELATED APPLICATIONS

The present application claims the benefit of U.S. Provisional Patent Application Nos. 61/985,444 filed on Apr. 28, 2014 in the names of Matthias Georg Gottwald et al., and 61/986,059 filed on Apr. 29, 2014, in the names of Matthias Georg Gottwald et al., the disclosures of which are expressly incorporated by reference herein in their entireties.

TECHNICAL FIELD

The present disclosure generally relates to magnetic tunnel junction (MTJ) devices. More specifically, the present disclosure relates to uniform predetermined crystal orientation seed layers for high perpendicular magnetic anisotropy materials.

BACKGROUND

Unlike conventional random access memory (RAM) chip technologies, data is stored by magnetization of storage elements in magnetic RAM (MRAM). The basic structure of the storage elements consists of metallic ferromagnetic layers separated by a thin tunneling barrier. Typically, the ferromagnetic layers underneath the barrier (e.g., the pinned layer) have a magnetization that is fixed in a particular direction. The ferromagnetic magnetic layers above the tunneling barrier (e.g., the free layer) have a magnetization direction that may be altered to represent either a "1" or a "0." For example, a "1" may be represented when the free layer magnetization is anti-parallel to the fixed layer magnetization. In addition, a "0" may be represented when the free layer magnetization is parallel to the fixed layer magnetization or vice versa. One such device having a fixed layer, a tunneling layer, and a free layer is a magnetic tunnel junction (MTJ). The electrical resistance of an MTJ depends on whether the free layer magnetization and fixed layer magnetization are parallel or anti-parallel to each other. A memory device such as MRAM is built from an array of individually addressable MTJs.

To write data in a conventional MRAM, a write current, which exceeds a critical switching current, is applied through an MTJ. Application of a write current that exceeds the critical switching current changes the magnetization direction of the free layer. When the write current flows in a first direction, the MTJ may be placed into or remain in a first state in which its free layer magnetization direction and fixed layer magnetization direction are aligned in a parallel orientation. When the write current flows in a second direction, opposite to the first direction, the MTJ may be placed into or remain in a second state in which its free layer magnetization and fixed layer magnetization are in an anti-parallel orientation.

To read data in a conventional MRAM, a read current may flow through the MTJ via the same current path used to write data in the MTJ. If the magnetizations of the MTJ's free layer and fixed layer are oriented parallel to each other, the MTJ presents a parallel resistance. The parallel resistance is different than a resistance (anti-parallel) the MTJ would present if the magnetizations of the free layer and the fixed layer were in an anti-parallel orientation. In a conventional MRAM, two distinct states are defined by these two different resistances of an MTJ in a bitcell of the MRAM. The two different resistances indicate whether a logic "0" or a logic "1" value is stored by the MTJ.

SUMMARY

A method of fabricating a perpendicular magnetic tunnel junction (pMTJ) device includes growing a seed layer on a first electrode of the pMTJ device. The seed layer has a uniform predetermined crystal orientation along a growth axis. The method also includes planarizing the seed layer while maintaining the uniform predetermined crystal orientation of the seed layer.

A pMTJ device includes a seed layer on a first electrode of the pMTJ device. The seed layer has a uniform predetermined crystal orientation along a growth axis and a substantially planar surface. The pMTJ device also includes a magnetic material on the substantially planar surface of the seed layer.

A pMTJ device includes a seed layer on a first electrode of the pMTJ device. The seed layer has a uniform predetermined crystal orientation at least along its growth axis and a substantially planar surface. The pMTJ device also includes means for generating magnetic charge on the substantially planar surface of the seed layer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
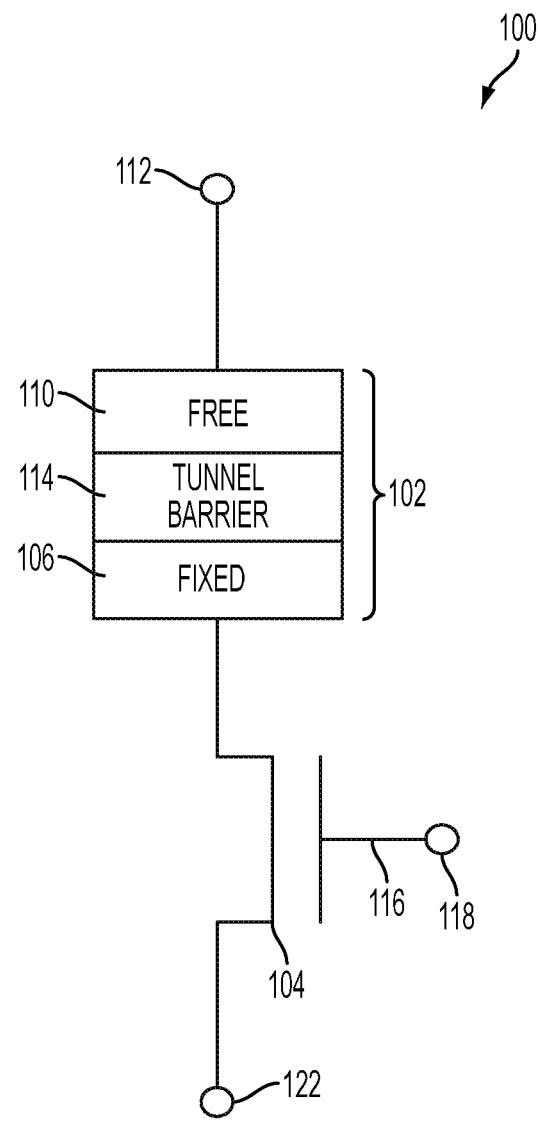
FIG. 1 is a diagram of a magnetic tunnel junction (MTJ) device connected to an access transistor.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

MRAM is a non-volatile memory technology that uses magnetic elements. For example, spin transfer torque magnetoresistive random access memory (STT-MRAM) uses electrons that become spin-polarized as the electrons pass through a thin film (spin filter). STT-MRAM is also known as spin transfer torque RAM (STT-RAM), spin torque transfer magnetization switching RAM (Spin-RAM), and spin momentum transfer (SMT-RAM).

Bitcells of a magnetic random access memory may be arranged in one or more arrays including a pattern of memory elements (e.g., MTJs in case of MRAM). Spin-transfer-torque magnetic random access memory (STT-MRAM) is an emerging nonvolatile memory that has advantages of non-volatility. In particular, STT-MRAM operates at a higher speed than off chip dynamic random access memory (DRAM). In addition, STT-MRAM has a smaller chip size than embedded static random access memory (eSRAM), unlimited read/write endurance, and a low array leakage current.

Perpendicular magnetic tunnel junctions (pMTJs) may be elements within STT-MRAMs. Devices such as pMTJs, however, specify the use of high perpendicular magnetic anisotropy (PMA) materials, which can be used as reference layers. The use of perpendicular magnetic multilayers containing only 3d magnetic elements is considered beneficial, where 3d refers to the position of the chemical element in the periodic table (e.g., elements 21-30). Examples of magnetic multilayers containing 3d magnetic elements that may be used as high PMA materials include cobalt nickel (Co/Ni) or cobalt iron/nickel (CoFe/Ni)). In particular, the use of 3d elements may be beneficial from the point of view of the patterning process because their usage improves the effectiveness of reactive ion etching (RIE) and the spin transfer torque efficiency. These materials, which may include a ten (10) to (20) nanometer thick nickel chromium (NiCr) alloy, may also specify crystalline seed layers that provide a high texture and a small lattice mismatch. Unfortunately, the crystallinity of the seed layers may lead to a degree of roughness (e.g., greater than 0.5 nanometers). This degree of roughness may be incompatible with obtaining the high magnetoresistive performance of, for example, a magnesium oxide (MgO) based tunneling device or other MRAM-based devices.

One aspect of the disclosure includes a two-step approach to manufacture seed layers with high crystalline textures for perpendicular magnetic material elements (e.g., a NiCr-alloy seed layer for a [CoFe/Ni] multilayer). This two-step approach also fulfills the topological specifications of high performance MgO-based pMTJs. The first step may include growing a seed layer on a first electrode of the pMTJ, in which the seed layer has a uniform and predetermined crystal orientation along a growth axis of the seed layer. The second step may include planarizing the seed layer while maintaining the uniform, predetermined crystal orientation along the growth direction, or the direction of the growth axis of the seed layer. Etching processes such as chemical mechanical polishing (CMP) may be employed to planarize the seed layer. For example, CMP can planarize the seed layer to a predetermined smoothness of a root mean square (RMS) below 0.2 nanometers without changing the crystalline texture (i.e., the crystalline orientation along the growth axis) of a device. An initial thickness of the seed layer may be twenty-five (25) to thirty (30) nanometers. The thickness of the seed layer following planarization may be in the range of ten (10) to twenty (20) nanometers. The uniform, predetermined crystal orientation along the growth direction of the seed layer may be a (111) crystal orientation, for example.

FIG. 1 illustrates a memory cell 100 of a memory device including a magnetic tunnel junction (MTJ) 102 coupled to an access transistor 104. The memory device may be a magnetic random access memory (MRAM) device that is built from an array of individually addressable MTJs. An MTJ stack may include a free layer, a fixed layer and a tunnel barrier layer there between as well as one or more ferromagnetic layers. Representatively, a free layer 110 of the MTJ 102 is coupled to a bit line 112. The access transistor 104 is coupled between a fixed layer 106 of the MTJ 102 and a fixed potential node 122. A tunnel barrier layer 114 is coupled between the fixed layer 106 and the free layer 110. The access transistor 104 includes a gate 116 coupled to a word line 118.

Synthetic anti-ferromagnetic materials may be used to form the fixed layer 106 and the free layer 110. For example, the fixed layer 106 may comprise multiple material layers including a cobalt-iron-boron (CoFeB) layer, a ruthenium (Ru) layer and a cobalt-iron (CoFe) layer. In addition, the free layer 110 may also include multiple material layers including a cobalt-iron-boron (CoFeB) layer, a ruthenium (Ru) layer and a cobalt-iron (CoFe) layer. In addition, the tunnel barrier layer 114 may be magnesium oxide (MgO).

Figure 2:
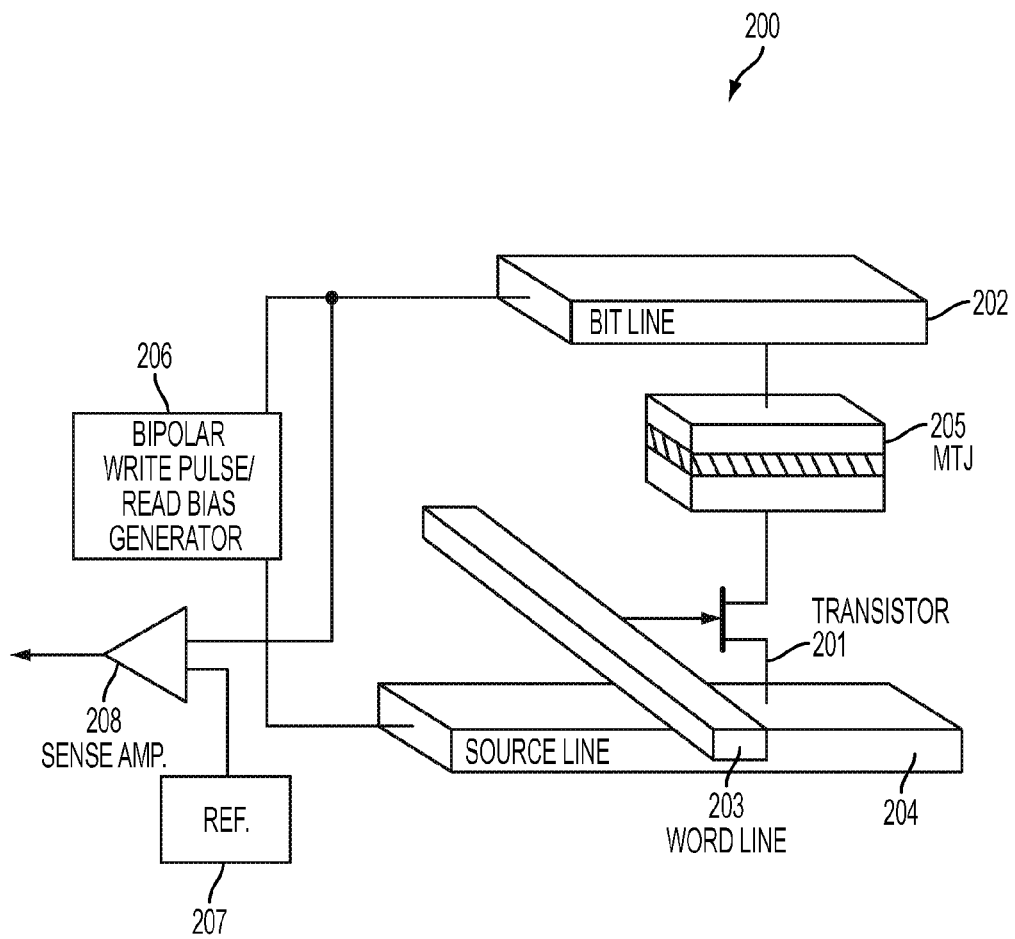
FIG. 2 is a conceptual diagram of a conventional magnetic random access memory (MRAM) cell including an MTJ.

FIG. 2 illustrates a conventional STT-MRAM bit cell 200. The STT-MRAM bit cell 200 includes a magnetic tunnel junction (MTJ) storage element 205, a transistor 201, a bit line 202 and a word line 203. The MTJ storage element is formed, for example, from at least two ferromagnetic layers (a pinned layer and a free layer), each of which can hold a magnetic field or polarization, separated by a thin non-magnetic insulating layer (tunneling barrier). Electrons from the two ferromagnetic layers can penetrate through the tunneling barrier due to a tunneling effect under a bias voltage applied to the ferromagnetic layers. The magnetic polarization of the free layer can be reversed so that the polarity of the pinned layer and the free layer are either substantially aligned or opposite. The resistance of the electrical path through the MTJ varies depending on the alignment of the polarizations of the pinned and free layers. This variance in resistance may be used to program and read the bit cell 200. The STT-MRAM bit cell 200 also includes a source line 204, a sense amplifier 208, read/write circuitry 206 and a bit line reference 207.

The crystalline orientation along the growth axis (e.g., the texture) should be uniform between the seed layer and the high perpendicular magnetic anisotropy (PMA) material. The texture may be measured in a material by using x-ray diffraction. As described herein, the terms "high" or "good" texture may be uniform crystalline orientation along the growth axis of the seed layer. High PMA may also occur in conditions that are the opposite to magnetostatics. For example, in thin films having a thickness smaller than lateral dimensions, a magnetostatic demagnetizing field may favor in-plane magnetization.

If strong PMA is desired for the magnetic material, a mechanism within a crystalline structure is specified to break the crystalline symmetry perpendicular to the plane. That is, some sort of "symmetry breaking" force or other mechanism is provided in the crystalline structure. In addition, the magnetic material may be crystalline. As a result, this magnetic material may exhibit a special crystalline axis in which the magnetization prefers to be directed, referred to herein as an "easy axis." Therefore, if strong PMA is desired, the direction of crystal growth, or the growth axis, extends in the same direction as the direction in which the easy axis points.

The direction of the crystal growth is not only important for providing strong PMA in the magnetic crystalline material, but also for providing strong PMA at an interface of a crystalline material. For example, cobalt nickel interfaces would apply. Important properties to examine would be the growth direction of a given crystal, and whether or not the interface anisotropy or interface PMA of a crystalline material is high or low for that specific growth direction. For example, in the case of cobalt nickel, the (111) crystal orientation direction achieves the highest PMA from the crystalline point of view and also from the interface anisotropy point of view. That is why it is important that cobalt nickel or cobalt iron nickel grow along the (111) crystal orientation axis.

Figure 3:
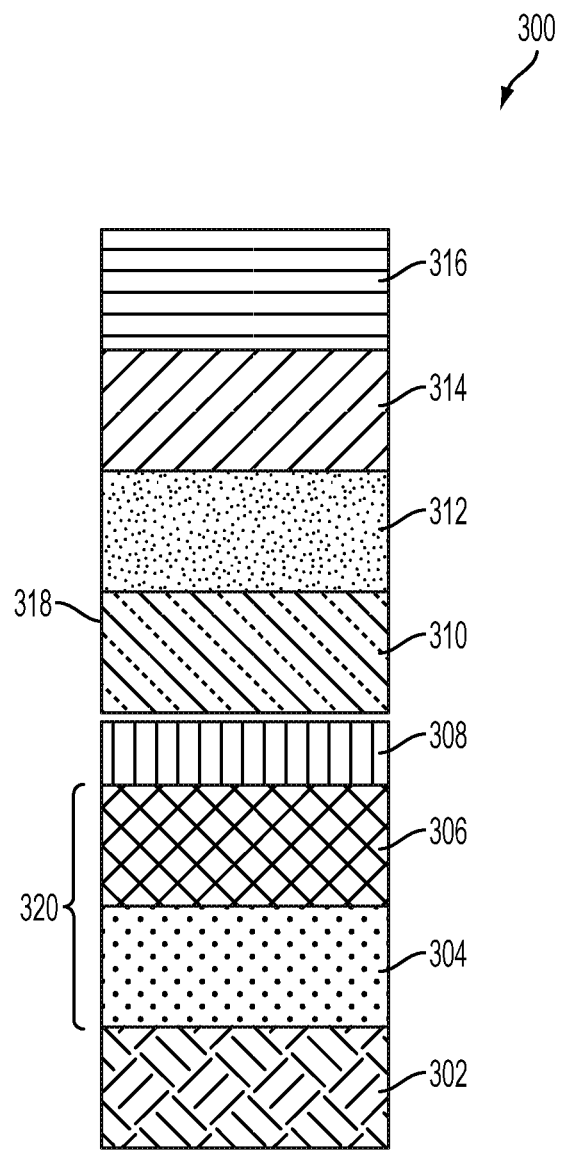
FIG. 3 is a schematic cross-sectional view of a perpendicular magnetic tunnel junction (pMTJ) structure according to aspects of the present disclosure.

FIG. 3 is a schematic cross-sectional view of a perpendicular magnetic tunnel junction (pMTJ) structure 300 according to aspects of the present disclosure. The pMTJ structure 300 (e.g., pMTJ device) includes a first electrode 302, a seed layer 304, a high perpendicular magnetic anisotropy (PMA) layer 306, and a texture breaking layer 308. The pMTJ structure 300 also includes a cobalt (C) iron (Fe) and boron (B) (CFB) based spin-polarizing layer 310, a tunneling barrier 312, a free layer 314, and a second electrode 316.

The seed layer 304 on the first electrode 302 may have a uniform predetermined crystal orientation along a growth axis of the seed layer 304, as well as a substantially planar surface of the seed layer 304. The texture of the seed layer may refer to the degree of crystalline order in a material, or how well-crystallized a given material is, within a particular crystal orientation or direction of interest. In one configuration, the uniform predetermined crystal orientation along the growth axis of the seed layer is a (111) crystal orientation. The high PMA layer 306 may be a magnetic material on the substantially planar surface of the seed layer 304. The seed layer 304 may be planarized to a thickness in the range of 10 (ten) to 20 (twenty) nanometers to provide a predetermined smoothness.

According to an aspect of the present disclosure, the smoothness of a surface of a crystalline structure is a property that occurs together with the crystalline orientation of that crystalline structure along a growth axis. The smoothness of a crystalline structure may be a root mean square (RMS) below 0.2 nanometers without changing the crystalline texture or the crystalline orientation along the growth axis. For example, the above-described smoothness may be specified for a material with a thickness in the range of 10 (ten) to 20 (twenty) nanometers. This exemplary thickness range is a thickness range in which chemical mechanical polishing (CMP) is feasible. By contrast, other conventional smoothness techniques (e.g., plasma smoothing treatment) may only be applicable to thicknesses of much smaller magnitudes, or different smoothing treatments, which may only be applicable to thicknesses of much larger magnitudes.

The first electrode 302 and the second electrode 316 can be any conductive material such as copper or aluminum. The seed layer 304 may be made of, or include, nickel chromium (NiCr), hafnium (Hf), ruthenium (Ru), a platinum (Pt) alloy or multilayer, or similar materials that have high texture and small lattice mismatch that may also have high crystallinity. The high PMA layer 306 may be made of multilayers that are based on a precious conductive material such as palladium or platinum with cobalt, or can be made of 3d metal multilayers that are based on a transition-conductive material like cobalt nickel or cobalt iron nickel. The texture breaking layer 308 may be tantalum, iron, and/or iron tantalum, and is usually inserted between the high PMA layer 306 and the CFB based spin-polarizing layer 310. The CFB based spin-polarizing layer 310 can be cobalt, iron and/or boron. The tunneling barrier 312 may be a magnesium oxide (MgO). For an MTJ, the tunneling barrier 312 may function as the MTJ's barrier layer. The reference layer or the fixed layer includes the materials between the first electrode 302 and a surface of the tunneling barrier 312.

The specification for a high PMA material and seed layer combination in a pMTJ structure may include a magnesium oxide (MgO) compatible topology, a compatible reactive ion etching (RIE) chemistry for patterning, and an overall structure that is compatible with a high spin transfer torque (STT) efficiency. Fabricating the pMTJ structure is performed to provide a high performance device with well-adapted crystallinity in the structure. The crystallinity in the structure enables desired magnetic properties for perpendicular materials, which may be based on 3d transition metals such as cobalt or nickel multilayer metallic structures.

A tradeoff occurs between the thickness of the seed layer 304 and the texture when the seed layer 304 is built. For example, if the seed layer 304 is too thin, then the degree of texture is poor. On the other hand, when the seed layer 304 is too thick, the seed layer exhibits a very rough surface. The seed layer 304 should have an increased thickness and a high texture. In addition, the surface of the seed layer 304 should be relatively smooth. Processes such as chemical mechanical polishing (CMP) can smooth the surface of the seed layer 304 to a degree of a few nanometers, for example. Some seed layers with smooth surfaces may also still have high-density textures because some crystalline material already exists in such seed layers.

In one configuration, the seed layer 304 has an increased thickness and a predetermined smoothness. In this configuration, the predetermined smoothness may be a root means square (RMS) less than 0.2 nanometers. In this configuration, the pMTJs (e.g., MTJ stacks) have a seed layer 304 that provides a number of performance advantages, including ease in patterning, high spin torque transfer efficiency, more efficient use of manufacturing materials, more precise device alignment, and lower device dependability for smaller device distributions. By having smoother seed layers and/or other layers, the effective interfaces between layers are also maintained, which improves the overall device performance.

In this configuration, the seed layer 304 is smoothed using CMP to provide a high crystalline smoothness that is specified for a surface 318 of the CFB based spin-polarizing layer 310. Roughness in the seed layer 304 prohibits the surface 318 of the CFB based spin-polarizing layer 310 in having a desired smoothness. The adapted crystallinity level 320 specifies an adapted crystallinity of the seed layer 304 and the high PMA layer 306, which is smoothed to achieve the high crystalline smoothness that is specified for the surface 318 of the CFB based spin-polarizing layer 310 and the tunneling barrier 312. Adapted crystallinity can be defined as a crystalline orientation that substantially increases the perpendicular part of the magnetic crystalline anisotropies and the magnetic interface anisotropies of the high PMA material.

A pMTJ manufacturing process, according to one aspect of the present disclosure, obtains both good performance and a good texture in the seed layer 304. For example, using CMP on the seed layer 304 provides both good texture and good performance. CMP on the seed layer 304, however, may contaminate the seed layer 304. According to one aspect of the present disclosure, any contamination or by-products of contamination in the seed layer 304 may be removed by processes such as pre-sputtering or mild etching.

Figures 4A, 4B, 4C:
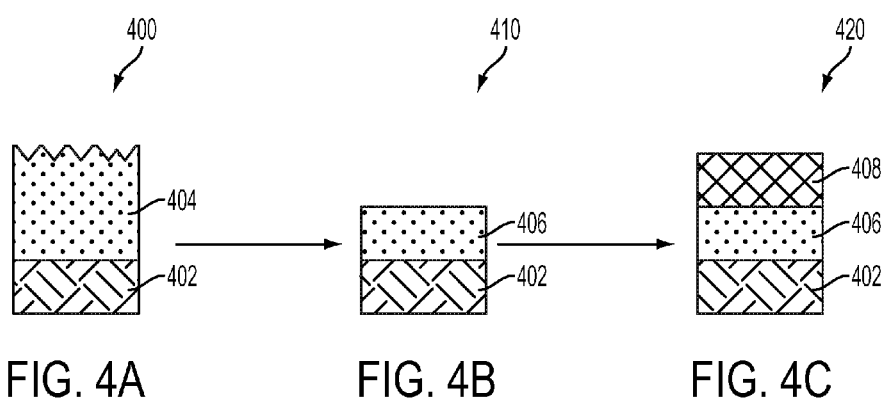
FIGS. 4A-4C are schematic cross-sectional views of a pMTJ structure illustrating a seed layer manufacturing process according to aspects of the present disclosure.

FIGS. 4A-4C are schematic cross-sectional views of a pMTJ structure illustrating a seed layer manufacturing process according to aspects of the present disclosure.

FIG. 4A shows a pMTJ structure 400 with a first electrode 402 and a rough seed layer 404. The rough seed layer 404 contains high texture as well as high roughness. FIG. 4A shows when the rough seed layer 404 is first deposited on the first electrode 402. In one configuration, around 25-30 nm of rough seed layer material is deposited on the first electrode 402. In one configuration, the rough seed layer 404 is a material including nickel chromium (NiCr), hafnium (Hf), ruthenium (Ru) or a platinum (Pt) alloy or multilayer.

FIG. 4B shows a pMTJ structure 410 with the first electrode 402 and a smoothed seed layer 406. The smoothed seed layer 406 of the pMTJ structure 410 results from CMP or another smoothing process applied to the rough seed layer 404 of the pMTJ structure 400 in FIG. 4A. The smoothed seed layer 406 has little roughness and is smooth, but still contains a high texture. In one configuration, the smoothed seed layer 406 is reduced to around 10-20 nm of material with CMP. For CMP, having to remove large amounts of material is not desired.

FIG. 4C shows a pMTJ structure 420 with the first electrode 402, the smoothed seed layer 406 and a high perpendicular magnetic anisotropy (PMA) layer 408. The high PMA layer 408 may be smooth or rough when deposited on the smoothed seed layer 406. The high PMA layer 408 over the smoothed seed layer 406 results in adapted crystallinity, which makes the pMTJ structure 420 a high-performance pMTJ structure. The high PMA layer 408 may also be a cobalt-platinum based material or reference layer, which can grow well on seed layers made from various materials, and which may also have some advantages for STT-MRAM applications. The seed layer may also be adapted to a multilayer transition metal layer such as cobalt nickel, or cobalt iron nickel, for example. In one configuration, platinum or palladium-based layers are avoided in the layers of a pMTJ structure.

There are two kinds of multilayers that can provide good PMA for use in the high PMA layer 408, for example. First, there are multilayers based on a precious conductive material such as palladium or platinum, with cobalt. Second, there are multilayers made from only 3d transition-conductive materials like cobalt nickel or cobalt iron nickel. From the perspective of STT-MRAM, it is desirable to use 3d transition conductive material only multilayers. Those 3d-transition conductive material only multilayers should have very well-adapted seed layers. An example of such a well-adapted seed layer is e.g., nickel chromium (NiCr). In addition, the well-adapted seed layer should be as thick as possible to obtain good texture and crystallinity. However, roughness problems—such as shown above in FIG. 4A—may occur at the seed layers. As a result, the present disclosure provides approaches to solve roughness issues and produce smooth seed layers.

Figures 5A, 5B:
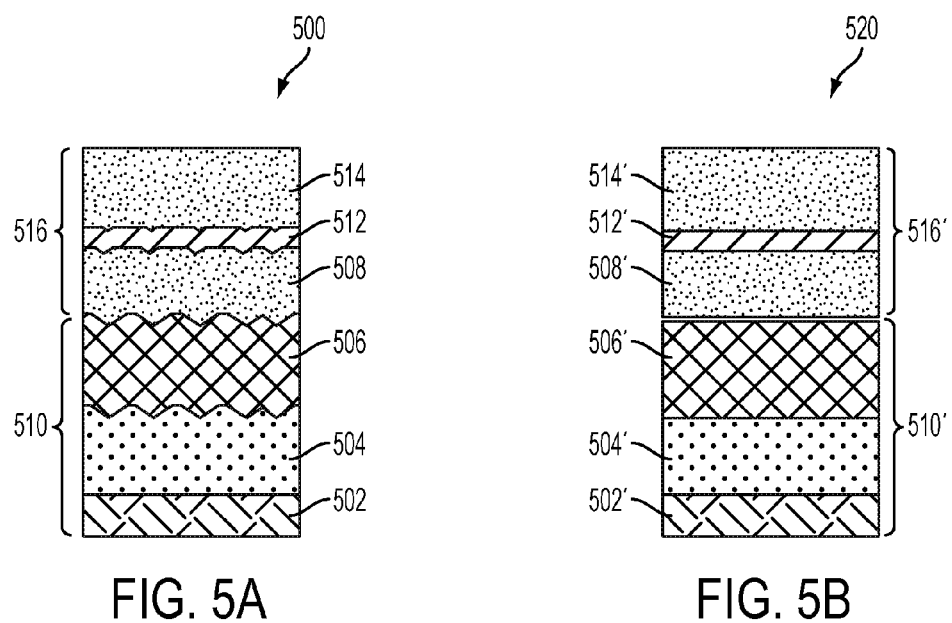
FIGS. 5A-5B are schematic cross-sectional views of pMTJ structures fabricated with a conventional seed layer manufacturing process versus a seed layer manufacturing process according to aspects of the present disclosure.

FIGS. 5A-5B are schematic cross-sectional views of pMTJ structures fabricated with a conventional seed layer manufacturing process versus a seed layer manufacturing process according to aspects of the present disclosure.

FIG. 5A shows a pMTJ structure 500 with a first electrode 502, a rough seed layer 504, a rough high PMA layer 506, a rough spin polarizing layer 508, a rough tunneling barrier 512, and a rough free layer 514, which may be carbon-iron (Fe)-boron (CFB) based. A seed layer and high PMA layer region 510 includes the first electrode 502, the rough seed layer 504 and the rough high PMA layer 506. A tunneling structure with barrier region 516 includes the rough spin polarizing layer 508, the rough tunneling barrier 512 and the rough free layer 514.

FIG. 5B shows a pMTJ structure 500 with a smoothed first electrode 502', a smoothed seed layer 504', a smoothed high PMA layer 506', a smoothed spin polarizing layer 508', a smoothed tunneling barrier 512', and a smoothed free layer 514'. A smoothed seed layer and high PMA layer region 510' includes the smoothed first electrode 502', the smoothed seed layer 504' and the smoothed high PMA layer 506'. A smoothed tunneling structure with barrier region 516' includes the smoothed spin polarizing layer 508', the smoothed tunneling barrier 512' and the smoothed free layer 514'. The pMTJ structure 520 results when the rough seed layer 504 of pMTJ structure 500 has undergone a smoothing process such as CMP.

In one configuration, the rough spin polarizing layer 508 and the smoothed spin polarizing layer 508' correspond to the CFB based spin-polarizing layer 310 of FIG. 3; the rough tunneling barrier 512 and the smoothed tunneling barrier 512' correspond to the tunneling barrier 312 of FIG. 3; and the rough free layer 514 and the smoothed free layer 514' correspond to the free layer 314 of FIG. 3.

The smoothed seed layer 504' (and smoothed seed layer 406 of FIGS. 4B-4C) on the first electrode 502 (and the first electrode 402 of FIGS. 4A-4C) may have a uniform predetermined crystal orientation at least along their respective growth axes as well as a substantially planar surface. In one configuration, the uniform predetermined crystal orientation along the growth axis is a (111) crystal orientation. The high PMA layer 506' (and the high PMA layer 408 of FIG. 4C) may be a magnetic material that is on the substantially planar surface of the smoothed seed layers 504' and 406.

Figure 6:
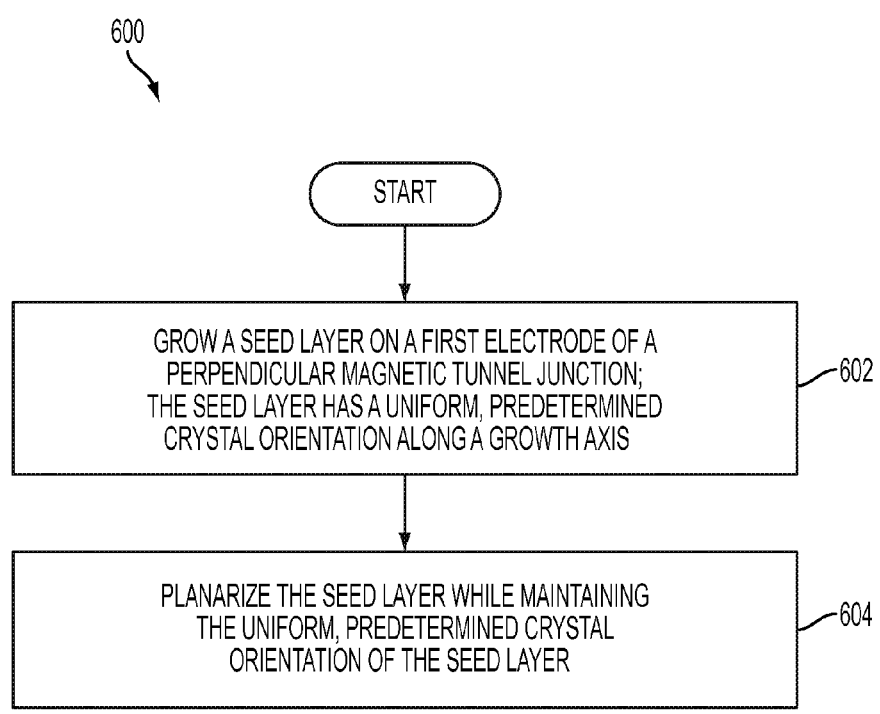
FIG. 6 is a process flow diagram illustrating a method of fabricating a pMTJ device according to aspects of the present disclosure.

FIG. 6 is a process flow diagram illustrating a method 600 of fabricating a pMTJ device according to aspects of the present disclosure. In block 602, a seed layer (e.g., seed layer 304, rough seed layer 404, rough seed layer 504) is grown on a first electrode (e.g., first electrode 302, first electrode 402, first electrode 502, smoothed first electrode 502') of a perpendicular magnetic tunnel junction (e.g., pMTJ structures 300, 400, 410, 420, 500, 520). The seed layer has a uniform, predetermined crystal orientation along a growth axis of the seed layer. In block 604, the seed layer is planarized (to become e.g., the smoothed seed layer 406, smoothed seed layer 504') while maintaining the uniform, predetermined crystal orientation of the seed layer along a growth axis of the seed layer.

In one configuration, the seed layer is etched after planarizing. In another configuration, planarizing the seed layer includes chemical mechanical polishing (CMP) the seed layer, and removing residue from the chemical mechanical polishing of the seed layer to maintain the uniform, predetermined crystalline orientation of the seed layer along a growth axis of the seed layer.

According to one aspect of the present disclosure, a perpendicular magnetic tunnel junction (pMTJ) device comprises a seed layer on a first electrode of the pMTJ device, the seed layer having a uniform predetermined crystal orientation along a growth axis and a substantially planar surface of the seed layer. The pMTJ device also includes means for generating magnetic charge on the substantially planar surface of the seed layer. In one configuration, the magnetic charge generating means is the high PMA layer 306, the high PMA layer 408, the rough high PMA layer 506, and/or the smoothed high PMA layer 506'. In another configuration, the aforementioned means may be any material or any layer configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

In one configuration, the conductive material used for the various conductive layers including the first electrodes 302, 402, 502, the smoothed first electrode 502' and the second electrode 316 are copper (Cu), or other conductive materials with high conductivity. Alternatively, the conductive material may include copper (Cu), silver (Ag), annealed copper (Cu), gold (Au), aluminum (Al), calcium (Ca), tungsten (W), zinc (Zn), nickel (Ni), lithium (Li) or iron (Fe). The aforementioned conductive material layers may also be deposited by electroplating, chemical vapor deposition (CVD), physical vapor deposition (PVD), sputtering, or evaporation.

The seed layers (e.g., seed layer 304, rough seed layer 404, rough seed layer 504, smoothed seed layer 406, smoothed seed layer 504') may be materials including nickel chromium (NiCr), hafnium (Hf), ruthenium (Ru), or a platinum (Pt) alloy or multilayer, or an alloy or multilayer of any of the previously listed materials other than platinum.

The high PMA layers 306, 408, 506, and 506' may include multilayers based on a precious conductive material such as palladium or platinum, with cobalt, such as cobalt palladium (Co/Pa) or cobalt platinum (Co/Pt), or alloys of any of the previously listed materials. The aforementioned high PMA layers may also include multilayers made from only 3d transition-conductive materials like cobalt nickel (Co/Ni) or cobalt iron/nickel (CoFe/Ni), or alloys of the previously listed materials. The 3d refers to an element's position in the periodic table (e.g., elements 21-30).

Any insulating materials used in any of the aforementioned pMTJ structures may be made of materials having a low k, or a low dielectric constant value, including silicon dioxide ($SiO_2$) and fluorine-doped, carbon-doped, and porous carbon-doped forms, as well as spin-on organic polymeric dielectrics such as polyimide, polynorbornenes, benzocyclobutene (BCB) and polytetrafluoroethylene (PTFE), spin-on silicone based polymeric dielectrics and silicon nitrogen-containing oxycarbides (SiCON).

Although not mentioned in the above process steps, photoresist, ultraviolet exposure through masks, photoresist development and lithography may be used. Photoresist layers may be deposited by spin-coating, droplet-based photoresist deposition, spraying, chemical vapor deposition (CVD), physical vapor deposition (PVD), sputtering, or evaporation. Photoresist layers may then be exposed and then etched by chemical etching processes using solutions such as Iron Chloride ($FeCl_3$), Cupric Chloride ($CuCl_2$) or Alkaline Ammonia ($NH_3$) to wash away the exposed photoresist portions, or dry etching processes using plasmas. Photoresist layers may also be stripped by a chemical photoresist stripping process or a dry photoresist stripping process using plasmas such as oxygen, which is known as ashing.

Figure 7:
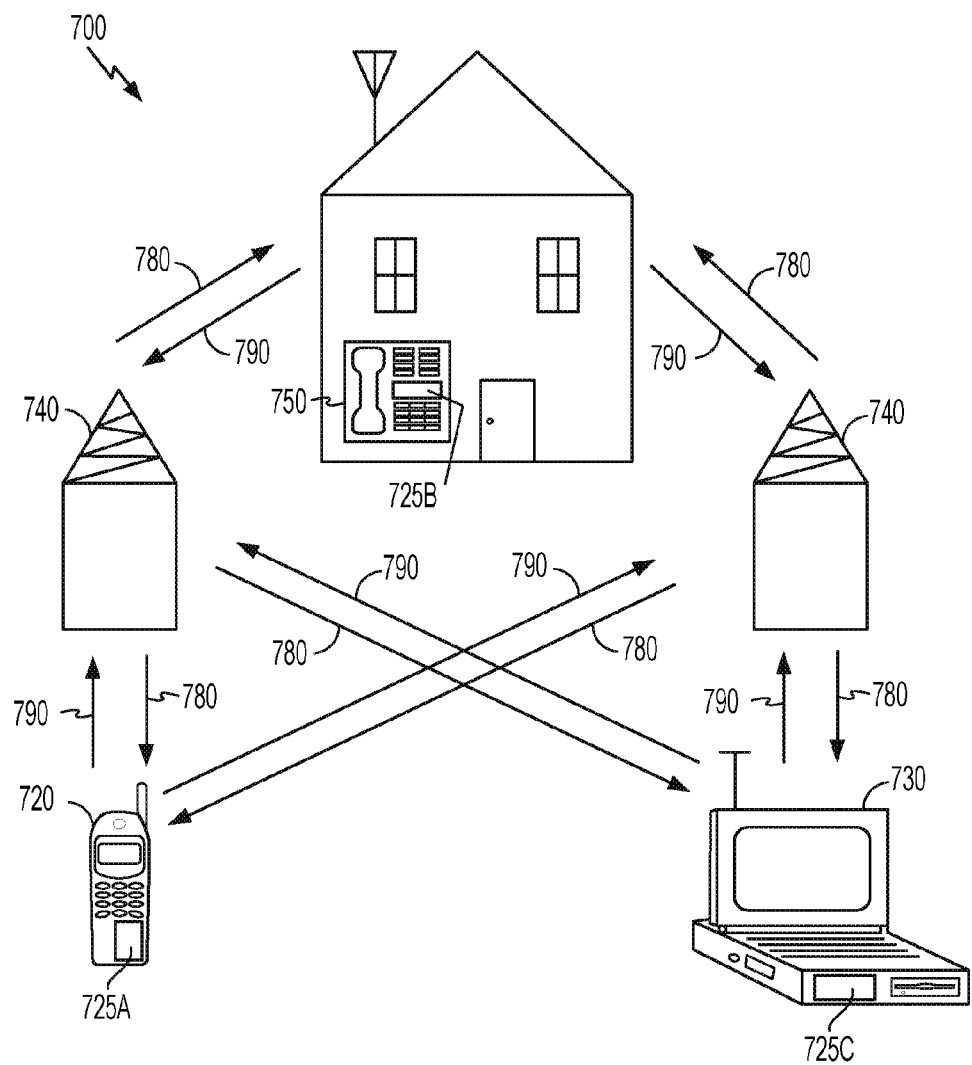
FIG. 7 is a block diagram showing an exemplary wireless communication system in which a configuration of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C and 725B that include the disclosed pMTJ device. It will be recognized that other devices may also include the disclosed pMTJ device, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, the remote units may be a mobile phone, a hand-held personal communication systems (PCS) unit, a portable data unit such as a personal data assistant, a GPS enabled device, a navigation device, a set top box, a music player, a video player, an entertainment unit, a fixed location data unit such as meter reading equipment, or other devices that store or retrieve data or computer instructions, or combinations thereof. Although FIG. 7 illustrates remote units according to the teachings of the disclosure, the disclosure is not limited to these exemplary illustrated units. Aspects of the disclosure may be suitably employed in many devices, which include the disclosed pMTJ device.

Figure 8:
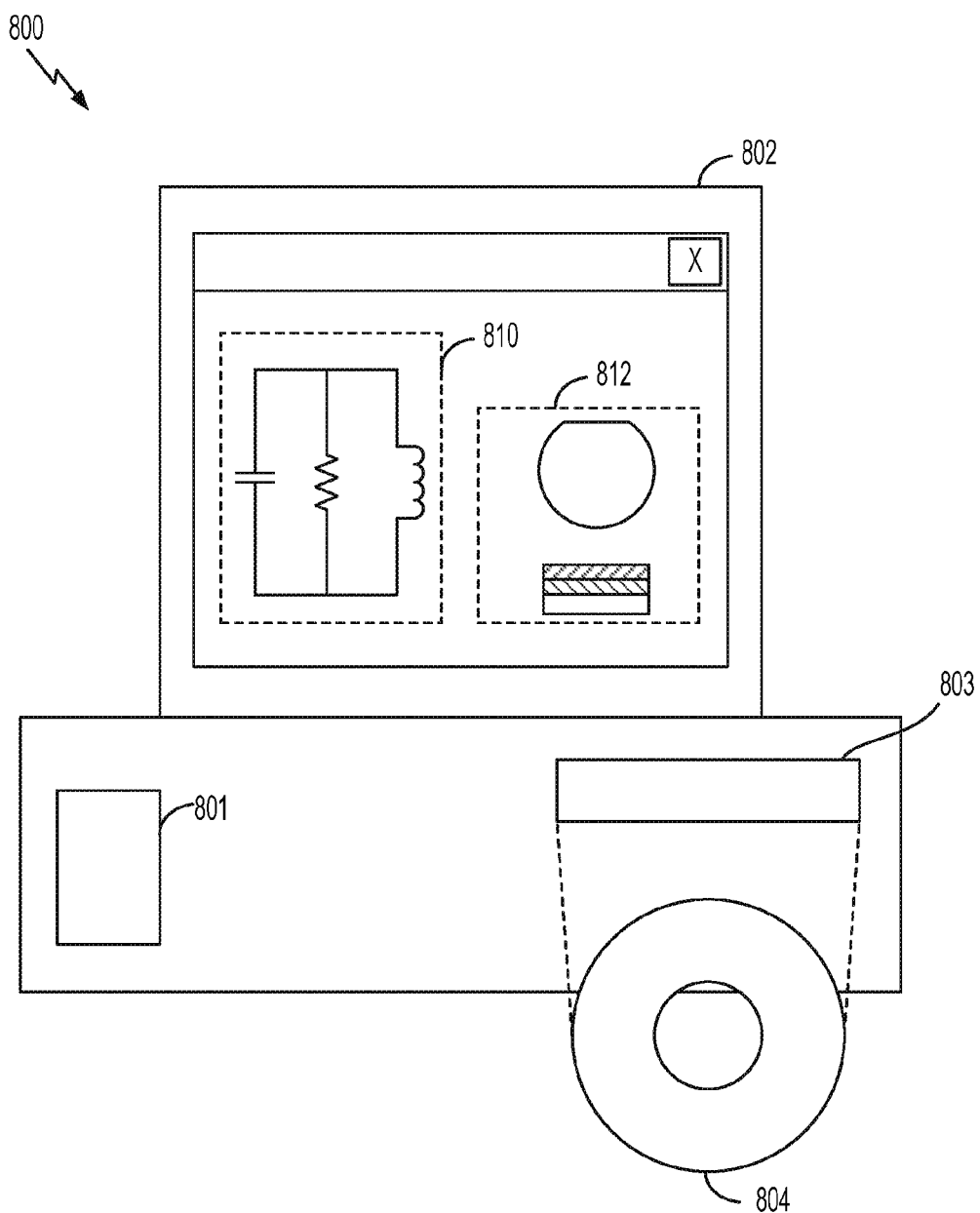
FIG. 8 is a block diagram illustrating a design workstation used for circuit, layout, and logic design of a semiconductor component according to one configuration.

FIG. 8 is a block diagram illustrating a design workstation used for circuit, layout, and logic design of a semiconductor component, such as the pMTJ device disclosed above. A design workstation 800 includes a hard disk 801 containing operating system software, support files, and design software such as Cadence or OrCAD. The design workstation 800 also includes a display 802 to facilitate design of a circuit 810 or a semiconductor component 812 such as a pMTJ device. A storage medium 804 is provided for tangibly storing the circuit design 810 or the semiconductor component 812. The circuit design 810 or the semiconductor component 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may include specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit design 810 or the semiconductor component 812 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

The exemplary aspects discussed herein, beneficially allow the MTJ stack to be protected from at least the process related damages described above, thereby generating high yield in the fabrication of MTJs. It should be appreciated that the various layers of the MTJ stack are provided merely for illustration and not for limitation. Additional layers may be added and/or layers may be removed or combined and may comprise different materials then illustrated.

It should be appreciated that memory devices including the MTJ storage elements described herein may be included within a mobile phone, portable computer, hand-held personal communication system (PCS) unit, a portable data unit such as a personal data assistants (PDA), a GPS enabled device, a navigation device, a set top box, a music player, a video players, an entertainment unit, a fixed location data unit such as meter reading equipment, or any other device that stores or retrieves data or computer instructions, or any combination thereof. Accordingly, aspects of the disclosure may be suitably employed in any device, which includes active integrated circuitry including memory having MTJ storage elements as disclosed herein.

Further, it should be appreciated that various to memory devices can include an array of MTJ storage elements as disclosed herein. Additionally, the MTJ storage elements disclosed herein may be used in various other applications, such as in logic circuits. Accordingly, although potions of the foregoing disclosure discuss the stand-alone MTJ storage element, it will be appreciated that various aspects can include devices into which the MTJ storage element is integrated.

Accordingly, aspects can include machine-readable media or computer-readable media embodying instructions which when executed by a processor transform the processor and any other cooperating elements into a machine for performing the functionalities described herein as provided for by the instructions.

While the foregoing disclosure shows illustrative aspects, it should be noted that various changes and modifications could be made herein without departing from the scope of the disclosure as defined by the appended claims. The functions, steps and/or actions of the method claims in accordance with the aspects described herein need not be performed in any particular order. Furthermore, although elements of the aspects may be described or claimed in the singular, the plural is contemplated unless limitation to the singular is explicitly stated.

Although the present disclosure and its advantages have been described in detail, it should be understood that various changes, substitutions and alterations can be made herein without departing from the technology of the disclosure as defined by the appended claims. For example, relational terms, such as "above," "below," "top" and "bottom" are used with respect to a substrate or electronic device. Of course, if the substrate or electronic device is inverted, above becomes below, top becomes bottom and vice versa. Additionally, if oriented sideways, the terms "above," "below," "top" and "bottom" may refer to sides of a substrate or electronic device, for example.

The word "exemplary" is used herein to mean "serving as an example, instance, or illustration." Any aspect described herein as "exemplary" is not necessarily to be construed as preferred or advantageous over other aspects. Likewise, the term "aspects of the disclosure" does not require that all aspects of the disclosure include the discussed feature, advantage or mode of operation. The terminology used herein is for the purpose of describing particular aspects only and is not intended to be limiting of aspects of the disclosure.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A perpendicular magnetic tunnel junction (pMTJ) device, comprising:
    a seed layer directly on a surface of a first electrode of the pMTJ device, the seed layer having a uniform predetermined crystal orientation at least along a growth axis and a substantially planar surface;
    a magnetic material on the substantially planar surface of the seed layer;

a texture breaking layer on the magnetic material; and
a spin polarizing layer on the texture breaking layer.

2. The pMTJ device of claim 1, in which the magnetic material comprises a 3d multilayer, transition conductive material.

3. The pMTJ device of claim 1, in which the seed layer comprises a nickel chromium (NiCr), hafnium (Hf), ruthenium (Ru), or a platinum (Pt) alloy or multilayer.

4. The pMTJ device of claim 1, in which a smoothness of the substantially planar surface of the seed layer comprises a root mean square (RMS) below 0.2 nanometers.

5. The pMTJ device of claim 1, in which a thickness of the seed layer is in a range of ten (10) to twenty (20) nanometers.

6. The pMTJ device of claim 1 integrated into a mobile phone, a set top box, a music player, a video player, an entertainment unit, a navigation device, a computer, a hand-held personal communication systems (PCS) unit, a portable data unit, and/or a fixed location data unit.

7. A perpendicular magnetic tunnel junction (pMTJ) device, comprising:
a seed layer directly on a surface of a first electrode of the pMTJ device, the seed layer having a uniform predetermined crystal orientation at least along a growth axis and a substantially planar surface
means for generating magnetic charge on the substantially planar surface of the seed layer;
a texture breaking layer on the magnetic charge generating means; and
a spin polarizing layer on the texture breaking layer.

8. The pMTJ device of claim 7, in which the magnetic charge generating means comprises a 3d multilayer, transition conductive material.

9. The pMTJ device of claim 7, in which the seed layer comprises a nickel chromium (NiCr), hafnium (Hf), ruthenium (Ru), or a platinum (Pt) alloy or multilayer.

10. The pMTJ device of claim 7, in which a smoothness of the substantially planar surface of the seed layer comprises a root mean square (RMS) below 0.2 nanometers.

11. The pMTJ device of claim 7, in which a thickness of the seed layer is in a range of ten (10) to twenty (20) nanometers.

12. The pMTJ device of claim 7 integrated into a mobile phone, a set top box, a music player, a video player, an entertainment unit, a navigation device, a computer, a hand-held personal communication systems (PCS) unit, a portable data unit, and/or a fixed location data unit.

* * * * *